(12) United States Patent
Giandalia et al.

(10) Patent No.: US 7,671,638 B2
(45) Date of Patent: Mar. 2, 2010

(54) NEGATIVE N-EPI BIASING SENSING AND HIGH SIDE GATE DRIVER OUTPUT SPURIOUS TURN-ON PREVENTION DUE TO N-EPI P-SUB DIODE CONDUCTION DURING N-EPI NEGATIVE TRANSIENT VOLTAGE

(75) Inventors: Marco Giandalia, Palermo (IT); Sergio Morini, Pavia (IT); Christian Locatelli, Broni (IT)

(73) Assignee: International Rectifier Corporation, El Segundo, CA (US)

( * ) Notice: Subject to any disclaimer, the term of this patent is extended or adjusted under 35 U.S.C. 154(b) by 54 days.

(21) Appl. No.: 12/146,736

(22) Filed: Jun. 26, 2008

(65) Prior Publication Data
US 2009/0002060 A1    Jan. 1, 2009

Related U.S. Application Data

(60) Provisional application No. 60/946,805, filed on Jun. 28, 2007.

(51) Int. Cl.
*H03B 1/00* (2006.01)
(52) U.S. Cl. ............... 327/108; 327/112; 327/82
(58) Field of Classification Search ......... 257/341, 257/375; 327/108, 112, 333, 82–84, 374–377, 327/419, 427
See application file for complete search history.

(56) References Cited
U.S. PATENT DOCUMENTS

| | | | |
|---|---|---|---|
| 5,502,412 A * | 3/1996 | Choi et al. ............ | 327/333 |
| 6,198,139 B1 | 3/2001 | Ishida | |
| 6,870,354 B2 | 3/2005 | Nishimaki | |
| 7,482,655 B2 * | 1/2009 | Nadd ............ | 257/341 |
| 2004/0212021 A1 * | 10/2004 | Shimizu ............ | 257/375 |

* cited by examiner

Primary Examiner—Long Nguyen
Assistant Examiner—Shikha Goyal
(74) Attorney, Agent, or Firm—Farjami & Farjami LLP

(57) ABSTRACT

A high-side driver in a driver circuit for driving a half-bridge stage having high- and low-side power switching devices series connected at a switched node, the high-side driver driving the high-side power switching device. The high-side driver including first and second complementary switched MOSFET series connected at a high-side node, driving the high-side power switching device, one of the MOSFETs having a parasitic bipolar transistor formed between the substrate, an N+ epitaxial region connected to the high-side driver supply voltage and the switched node, with the parasitic transistor having a base electrode formed by the N+ epitaxial region, an emitter electrode formed by the substrate and a collector electrode formed by the switched node, such that if a transient voltage that is negative with respect to the substrate is present at the high-side driver supply voltage, the parasitic transistor will conduct a short circuit current between the switched node and the substrate; a first circuit for controlling the conduction of the first and second MOSFETs to switch the high-side switching device ON and OFF; a diffusion in the N+ epitaxial region in which a terminal connected to the switched node is provided by the diffusion forming the collector of the parasitic transistor; and a second circuit coupled to the diffusion for sensing the high-side driver supply voltage at the epitaxial region and providing a signal to the first circuit to prevent turn-ON of the high-side power switching device.

6 Claims, 9 Drawing Sheets

NEGATIVE N-EPI BIASING SENSING AND HIGH SIDE GATE DRIVER OUTPUT SPURIOUS TURN-ON PREVENTION DUE TO N-EPI P-SUB DIODE CONDUCTION DURING N-EPI NEGATIVE TRANSIENT VOLTAGE

CROSS-REFERENCE TO RELATED APPLICATION

This application is based on and claims priority to U.S. Provisional Patent Application Ser. No. 60/946,805, filed on Jun. 28, 2007 and entitled NEGATIVE N- EPI BIASING SENSING AND HIGH SIDE GATE DRIVER OUTPUT SPURIOUS TURN-ON PREVENTION DUE TO N-EPI P-SUB DIODE CONDUCTION DURING N-EPI NEGATIVE TRANSIENT VOLTAGE, the entire contents of which are hereby incorporated by reference.

BACKGROUND OF THE INVENTION

The present invention relates gate drivers, and more specifically to detecting and preventing spurious gate driver output turn ON due to N- epi P-sub diode conduction during N-EPI negative transient voltage. These negative transients can occur due to one parasitic inductive and current transients.

What is needed is a circuit that will prevent an N- epi P-substrate an epitaxial diode formed by a parasitic transistor (base-emitter) from conducting during a negative transient voltage, causing a spurious turn ON at the high side gate driver output when voltage at the base of the transistor of the high driver goes very low or negative.

SUMMARY OF THE INVENTION

It is an object of the present invention to provide a circuit that prevents spurious turn ON of the high driver when voltage at a base of a parasitic transistor goes very low or negative.

Provided is a high-side driver in a driver circuit for driving a half-bridge stage having high- and low-side power switching devices series connected at a switched node, the high-side driver driving the high-side power switching device. The high-side driver including first and second complementary switched MOSFET series connected at a high-side node, driving the high-side power switching device, one of the MOSFETs having a parasitic bipolar transistor formed between the substrate, an N+ epitaxial region connected to the high-side driver supply voltage and the switched node, with the parasitic transistor having a base electrode formed by the N+ epitaxial region, an emitter electrode formed by the substrate and a collector electrode formed by the switched node, such that if a transient voltage that is negative with respect to the substrate is present at the high-side driver supply voltage, the parasitic transistor will conduct a short circuit current between the switched node and the substrate; a first circuit for controlling the conduction of the first and second MOSFETs to switch the high-side switching device ON and OFF; a diffusion in the N+ epitaxial region in which a terminal connected to the switched node is provided by the diffusion forming the collector of the parasitic transistor; and a second circuit coupled to the diffusion for sensing the high-side driver supply voltage at the epitaxial region and providing a signal to the first circuit to prevent turn-ON of the high-side power switching device.

Other features and advantages of the present invention will become apparent from the following description of the invention that refers to the accompanying drawings.

DETAILED DESCRIPTION OF EMBODIMENTS OF THE INVENTION

Driver circuits, for example, for driving half-bridge circuits that include two power switching devices series connected at a switched node, may include a high side driver that is connected to a higher voltage supply than a low side driver. A level shift circuit is used to level shift high side drive input signals to the driver circuit to drive the high side driver, which is referenced to a floating voltage level VS. This voltage level VS is present at the switched node located at the connection of the power switching devices of the half-bridge.

Figure 1A:
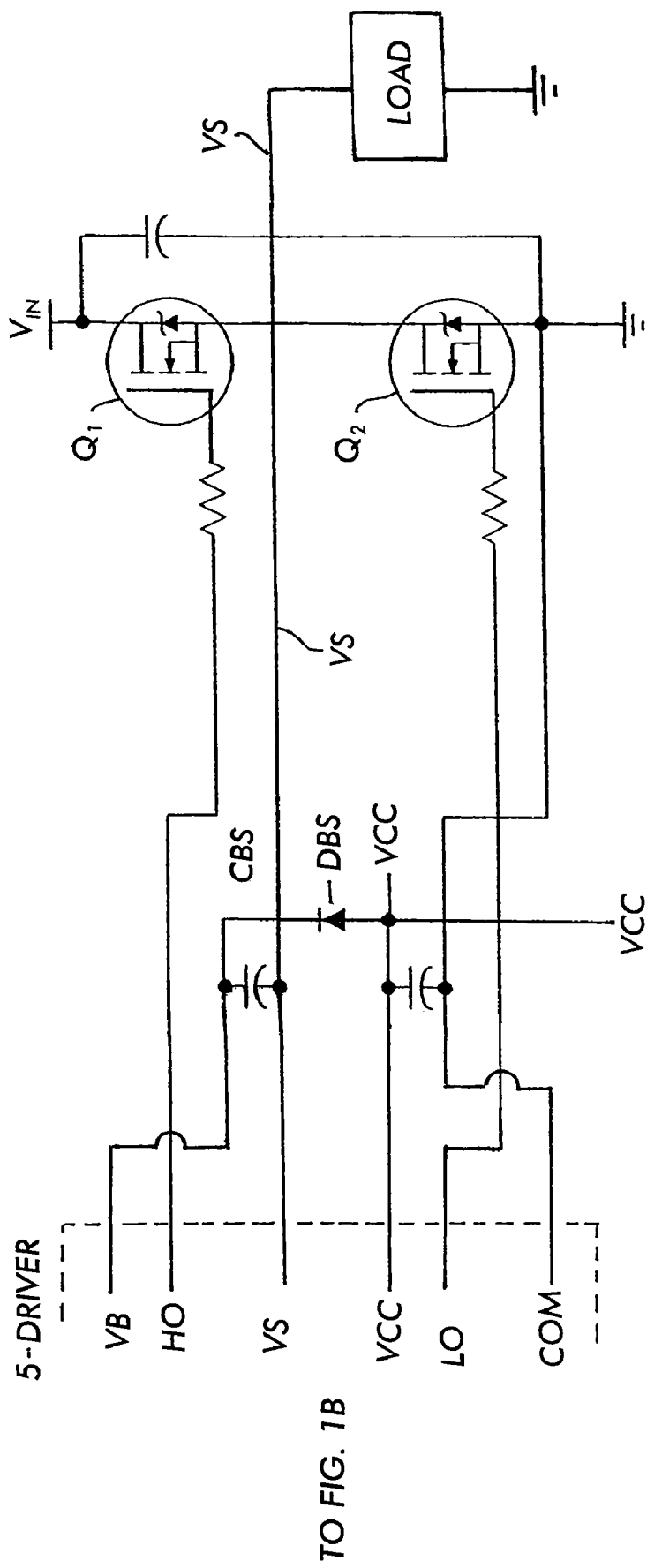
FIG. 1A is a circuit diagram of the connection between a driver circuit and a half-bridge switching stage that it controls.
Figure 1B:
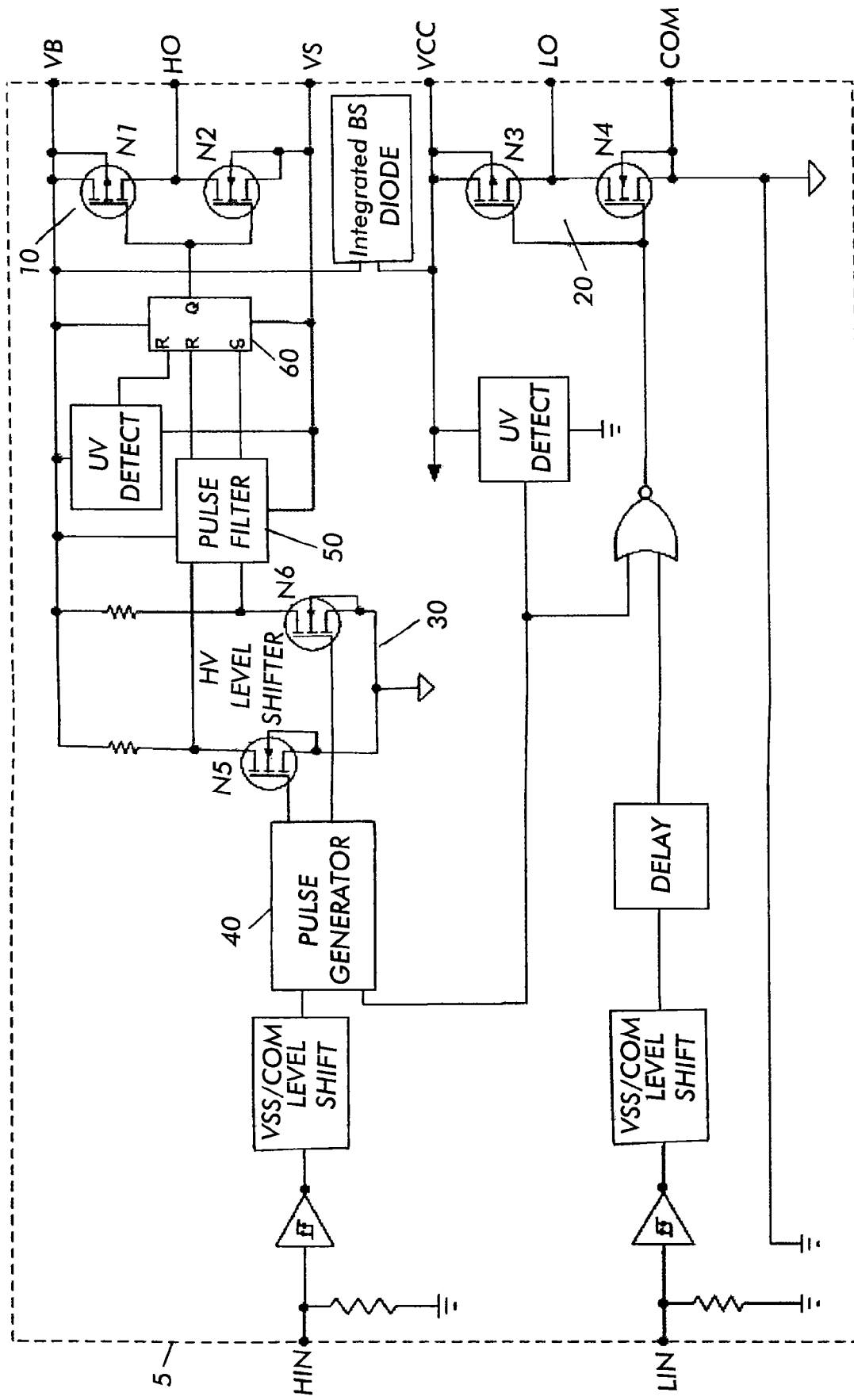
FIG. 1B is a diagram of the driver circuit of FIG. 1A.

FIGS. 1A and 1B show an example of such driver circuit 5. FIG. 1A illustrates power switching devices, e.g., MOSFETs, Q1 and Q2 series connected at a switched node to form a half-bridge. The node between the power switching devices is the switched node VS. As shown, a load is connected to the switched node VS. In the circuit shown, power switching devices Q1 and Q2 are alternately switched ON and OFF. When power switching device Q1 is turned ON, a current flowing through the switched node VS is sourced to the load. When power switching device Q1 is turned OFF, power switching device Q2 is turned ON and sinks the load circuit, e.g., inductive motor current if the load is a motor. There is a dead time between the ON times provided by dead time circuits, not shown.

As shown in FIG. 1B, the high side driver, indicated at 10, may comprise two complementary switched switching devices N1 and N2, for example, MOSFETs. Similarly, the low side driver, indicated at 20, may comprise two complementary switched switching devices N3 and N4, e.g., MOSFETs. The high side drive input signals at pin HIN to the driver circuit 5 are provided to a level shifting circuit 30 as pulses from a pulse generator 40. The level shifting circuit 30 includes transistors N5 and N6, whose drains are connected to a pulse filter 50. The pulse filter 50 controls the operation of a latch 60. When the latch 60 is set by the pulse filter 50, the high side driver 10 switching devices N1 and N2 provide an output on pin HO. A high signal at pin HO provides output to drive or turn the high side switching device Q1 ON. When the latch 60 is reset, pin HO goes low. A low signal at pin HO turns the high side switching device Q1 OFF.

Referring now to both FIGS. 1A and 1B, because the high side driver 10 is referenced to the floating voltage at pin VS, which is equal to the voltage at the switched node VS, it is necessary to provide an increased supply voltage to the high side driver 10 as well as to the level shifting circuit 30. This voltage is derived as a bootstrap voltage at pin VB from a bootstrap capacitor CBS. When the low side switching device Q2 is turned ON, capacitor CBS charges from a voltage source VCC through a bootstrap diode DBS. Accordingly, a voltage VCC appears across the capacitor CBS.

When low side switching device Q2 goes OFF, voltage at the switched node VS floats to a level above ground through high side switching device Q1 and voltage at pin VB coupled to the bootstrap capacitor CBS rises to a level above VCC. This provides a supply voltage to the high side driver 10.

Figure 2A:
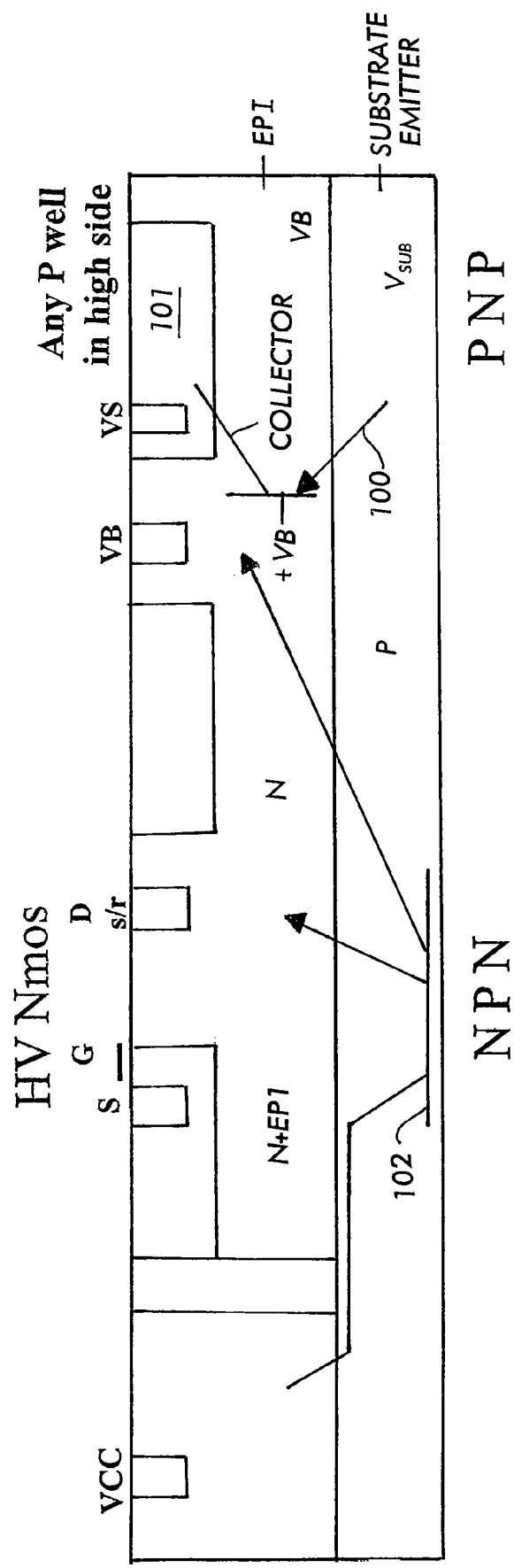
FIG. 2A is a diagram of a high voltage NMOS driver used in the circuit of FIG. 1A showing the parasitic transistors.

FIG. 2A shows a portion of the high voltage NMOS driver 10. As shown, the driver 10 includes a HV NMOS device N2. The source(s), gate (G) and drain (D) of this device are shown. Because of the N+ epitaxial region, a parasitic PNP transistor 100 is formed between VS, the epitaxial region N+ epi and the P-substrate. Another parasitic transistor, a NPN transistor 102, is also formed as shown. The problem arises with the parasitic PNP transistor 100. The PNP transistor 100 is present between pin VS and the substrate forming the base of the transistor. Pin VB is connected to the N+ epitaxial layer forming the base of this transistor and the P-substrate is the emitter of this transmitter. The collector of the transistor is connected typically to pin VS.

Figure 2B:
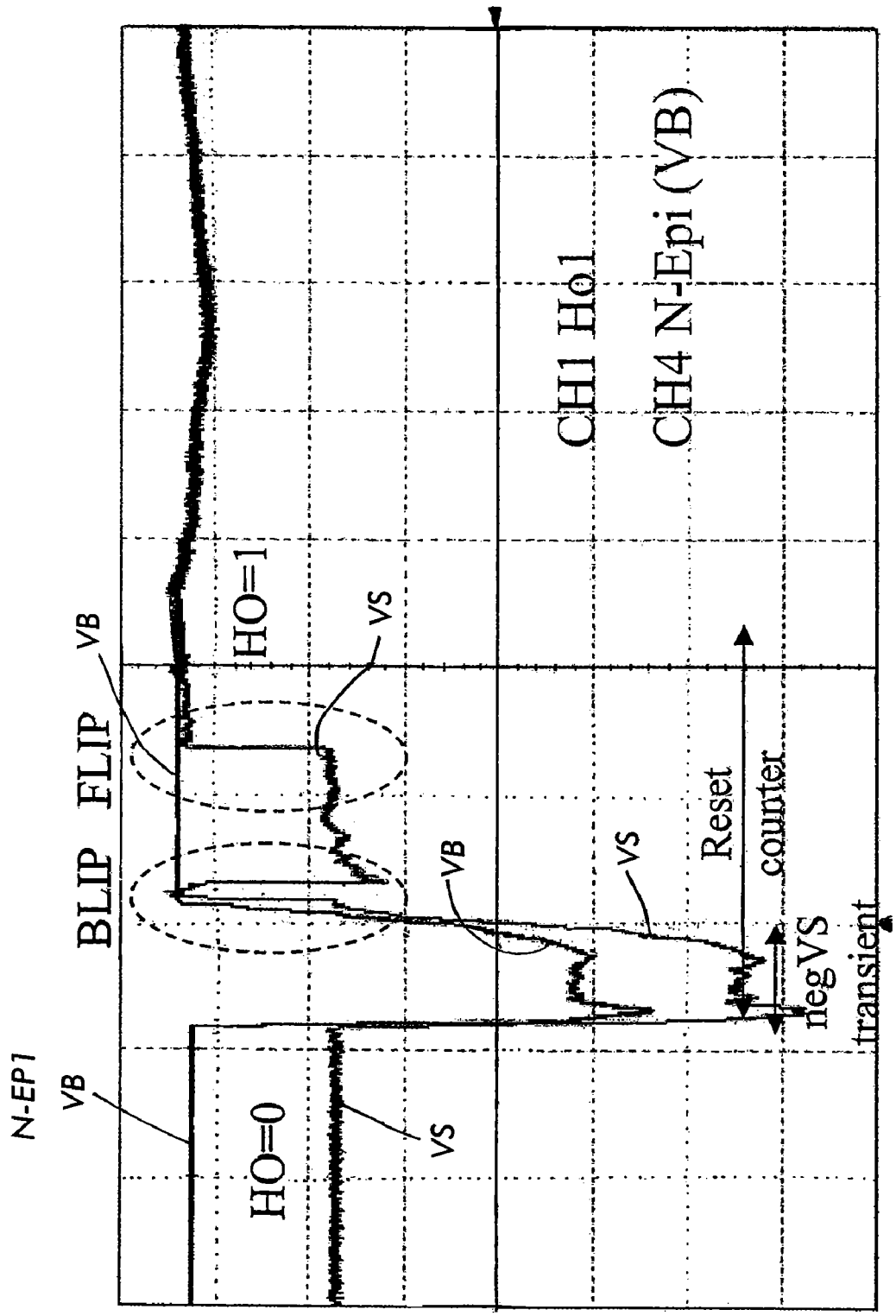
FIG. 2B is a graph showing negative transient at pin VB, the negative transient at the switching mode VS, and a counter start reset original time.

In certain situations, the N+ epi supply voltage, i.e., the voltage at pin VB, can go negative due to wire parasitic inductance and current transients. As shown in FIG. 2B, this will cause voltage at the switching node VS to go even more negative.

If voltage at pin VB goes very low or negative, the P-substrate to epitaxial diode formed by this parasitic transistor 100 (base-emitter) (FIG. 2A) will conduct current, causing a possible spurious set signal at the latch 60 (see FIG. 1B), and as a consequence a spurious turn ON at the high side gate driver output at pin HO.

Figure 3A:
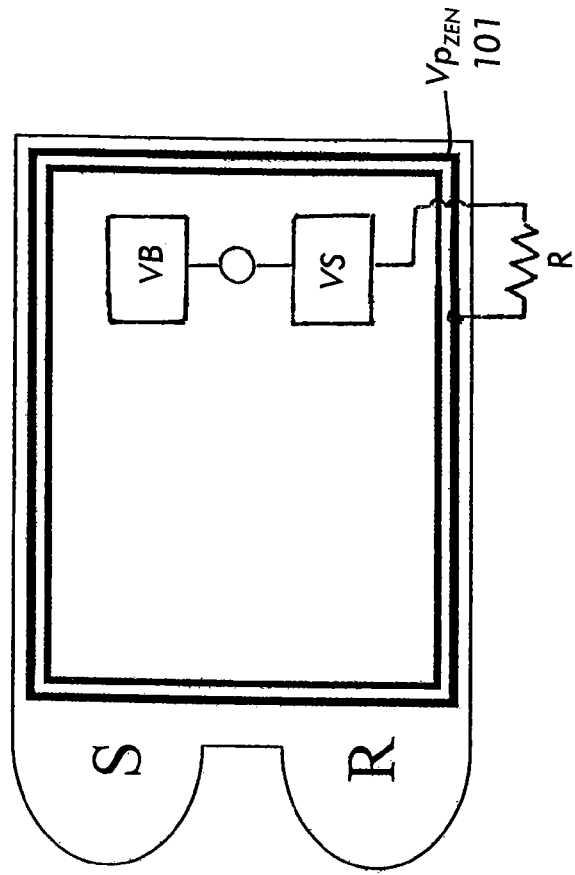
FIG. 3A is a diagram of a portion of the high voltage NMOS driver of FIG. 2A including a P diffusion forming a P-Zener ring added according to the invention.
Figure 3B:
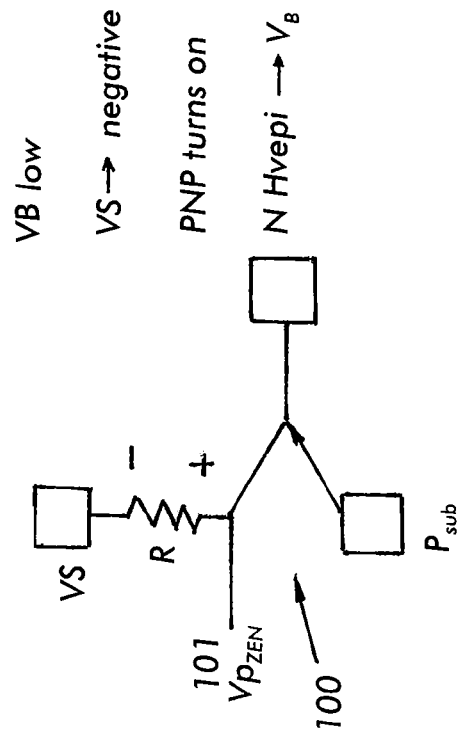
FIG. 3B is a diagram of the parasitic PNP transistor including the P-Zener ring and a resistance.
Figure 3C:
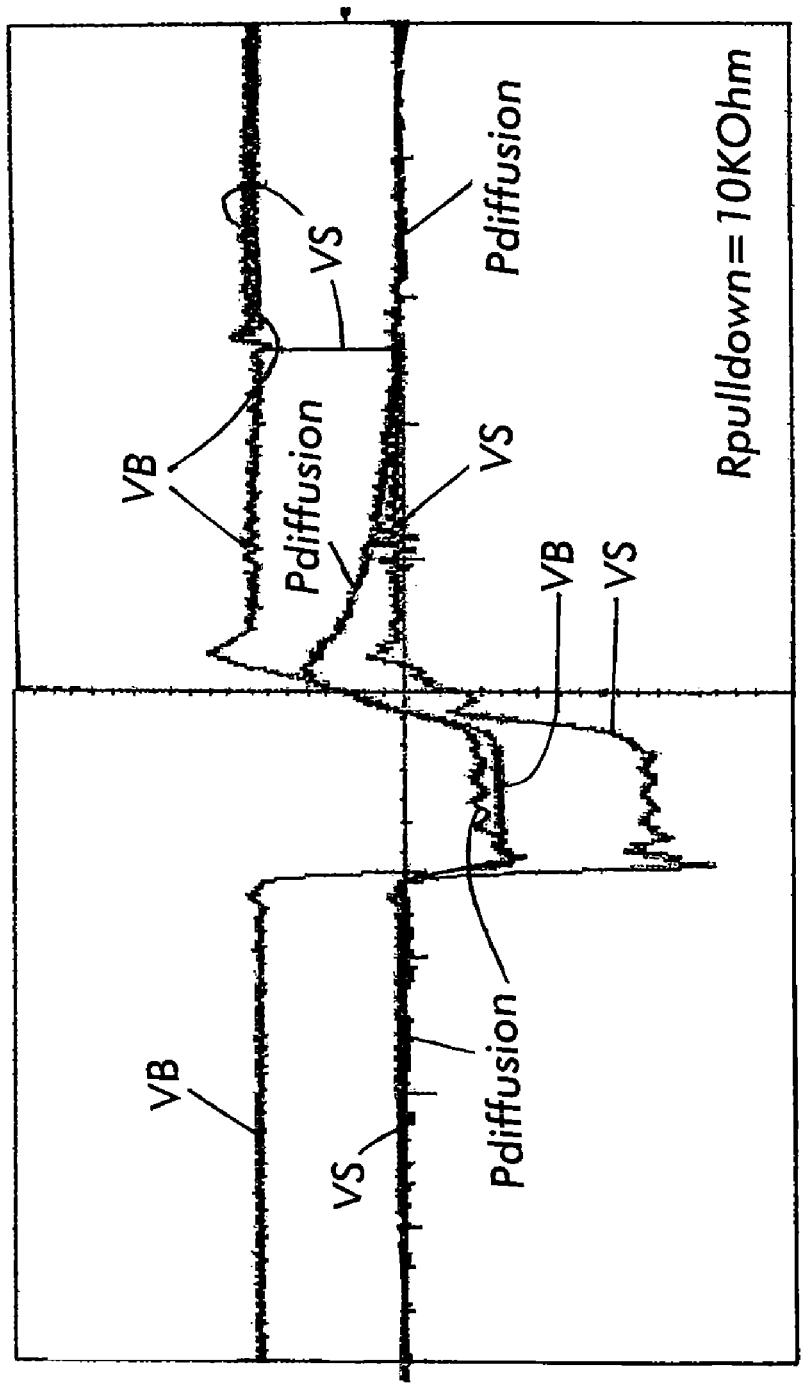
FIG. 3C is a graph showing the voltages at pin VB, pin VS and at the P-Zener ring $V_{P\text{-}Zener}$.

In accordance with the present invention, in order to sense the negative N–epitaxial voltage at pin VB, a P diffusion 101, illustrated in FIGS. 2A and 3A, is added. Any P type diffusion shape or dimension working as described can be used. As illustrated in FIG. 3A, a Zener ring 101 of P material provides an additional collector for the parasitic bipolar transistor 100. Also a resistance R is provided between pin VS and the Zener ring. FIG. 3B shows the parasitic PNP transistor 100 including the collector provided by the Zener ring 101 and the resistance R between pin VS and the Zener ring. The transistor 100 turns on when voltage at pin VB is low. The voltages at pin VB, pin VS, and at the P-diffusion during negative voltage at pin VB is shown in the graph of FIG. 3C. The resistor R is used to sense the negative voltage between VS and the Zener ring 101.

Figure 4:
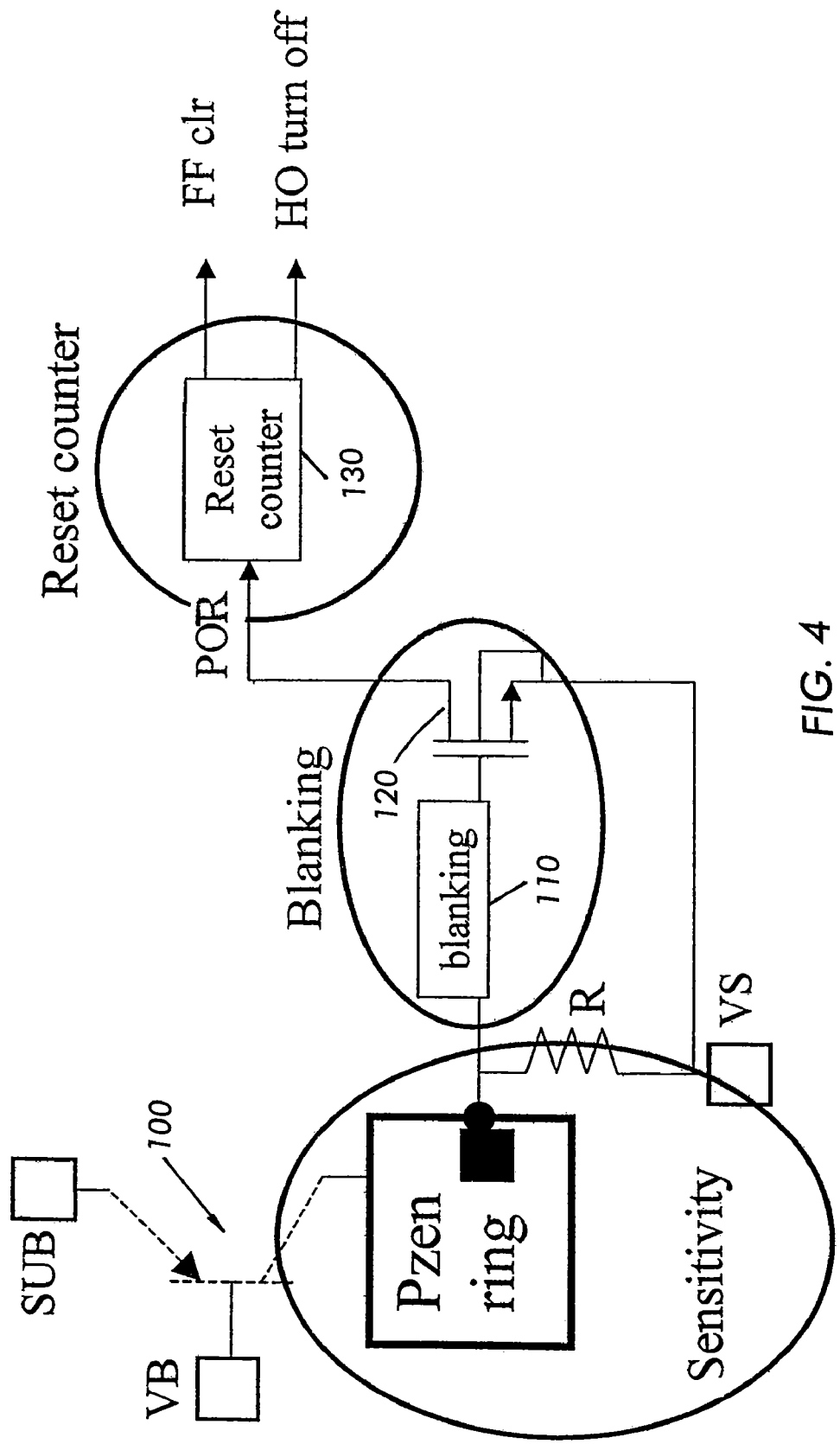
FIG. 4 is a diagram of the VS sensing and reset circuit.

FIG. 4 illustrates a circuit that performs sensing of the negative voltage VB and provides an active reset. As illustrated, the parasitic PNP transistor 100 has its emitter at the P-substrate, its base at pin VB (N+ Epi), and its collector at the added P-Zener ring. A resistance R of, for example 10K Ohms, is connected between the Zener ring and VS for sensing when the voltage at pin VB goes too low. When this occurs, a voltage is developed across the resistor R and, an additional reset is provided to the high side flip flop 60 (FIG. 1B) to keep it in a reset condition during the negative voltage condition at pin VB. As shown in FIG. 4, a blanking circuit 110 is provided to prevent turning on a transistor 120 for the blanking time duration. After the blanking time of, for example 50 nanoseconds, if the low voltage condition at pin VB is still present, a reset counter 130 is set, which provides a reset pulse of, for example 3 microseconds, during and over the negative voltage duration to clear the flip flop 60 (FF Clr) and ensure that the high side switching device Q1 is turned off by keeping the driver circuit off (HO turn off). This prevents any spurious set signal at the latch 60. Other parameter values for the resistance R, the blanking time, and the reset pulse can be chosen as necessary. Also, any passive or active device working as a collector current detector for the bipolar transistor 100 can be used in place of the resistor R.

Figure 5A:
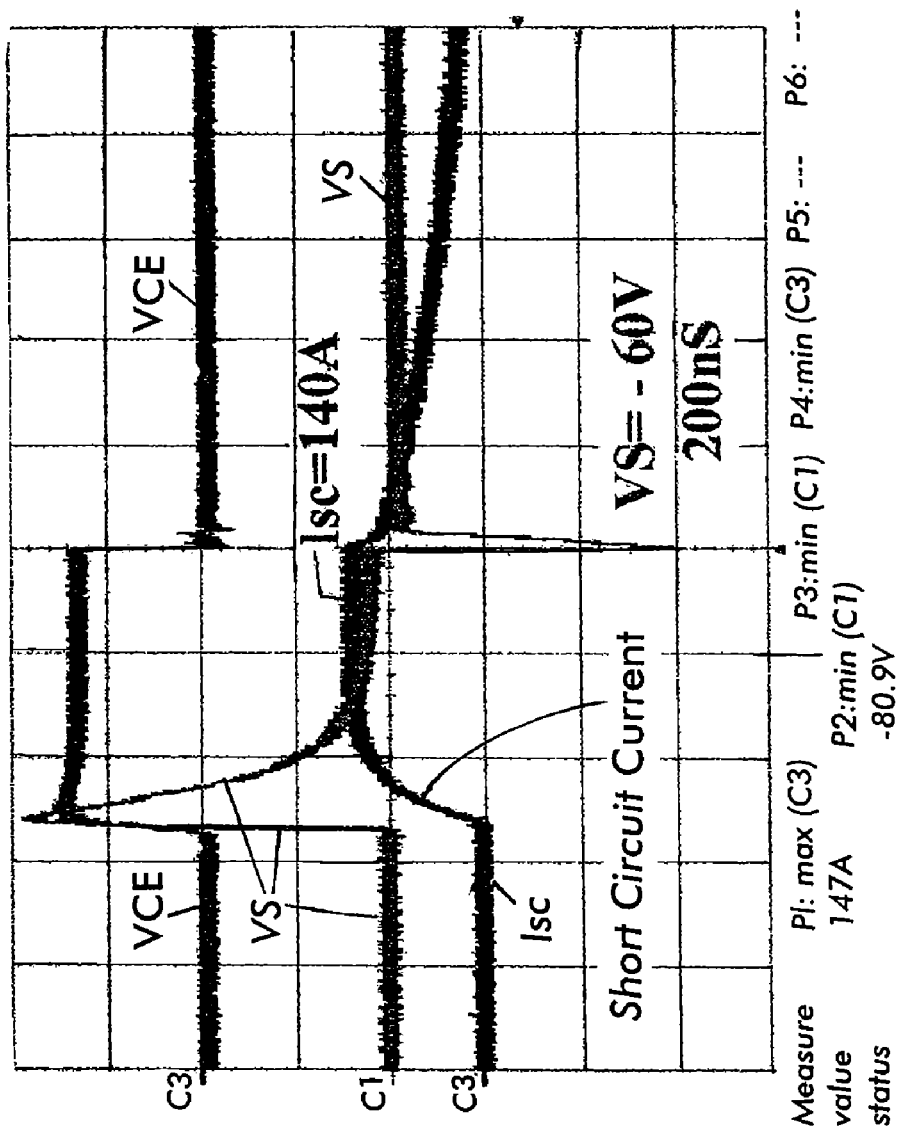
FIGS. 5A and 5B are graphs showing voltage VCE, short circuit current $I_{SC}$, and voltage at pin VS for two different die sizes of the high driver IC.
Figure 5B:
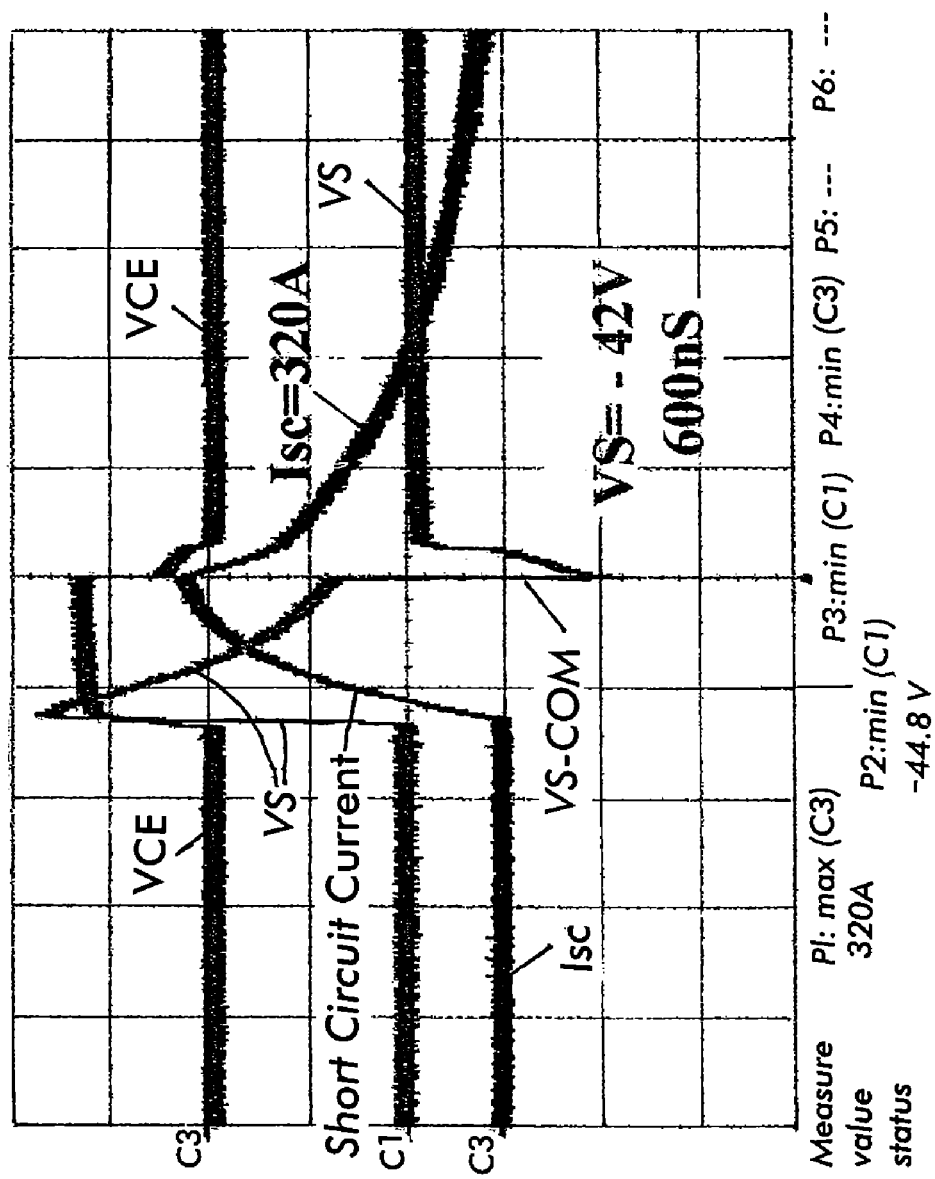

FIGS. 5A and 5B show the short circuit current for two different die sizes that can occur during negative VB, VS transients, leading to potential damage, what the invention prevents. In particular, FIG. 5A shows voltages VCE and at pin VS and short circuit current $I_{SC}$ for a die size 3.0 and FIG. 5B shows voltages VCE and at pin VS and short circuit current $I_{SC}$ for a die size 4.0. The short circuit currents are 140 and 320A, respectively.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A high-side driver in a driver circuit for driving a half-bridge stage having high- and low-side power switching devices series connected at a switched node, the high-side driver driving the high-side power switching device, the high-side driver comprising:

first and second complementary switched MOSFET series connected at a high-side node, driving the high-side power switching device, one of the MOSFETs having a parasitic bipolar transistor formed between the substrate, an N+ epitaxial region connected to the high-side driver supply voltage, and the switched node, with the parasitic transistor having a base electrode formed by the N+ epitaxial region, an emitter electrode formed by the substrate and a collector electrode formed by the switched node, such that if a transient voltage that is negative with respect to the substrate is present at the high-side driver supply voltage, said parasitic transistor will conduct a short circuit current between the switched node and the substrate;

a first circuit for controlling the conduction of the first and second MOSFETs to switch said high-side switching device ON and OFF;

a diffusion in said N+ epitaxial region in which a terminal connected to the switched node is provided by the diffusion forming the collector of the parasitic transistor; and a second circuit coupled to the diffusion for sensing the high-side driver supply voltage at the epitaxial region and providing a signal to said first circuit to prevent turn-ON of the high-side power switching device.

2. The high-side driver of claim 1, wherein the second circuit comprises a sensor connected to sense voltage between the switched node and the diffusion when said parasitic transistor begins to conduct due to a negative transient at said high-side supply voltage.

3. The high-side driver of claim 2, wherein the second circuit further comprises:

a transistor switch coupled to said sensor;

a blanking circuit to prevent turning ON of the transistor for duration of a preset blanking time; and a reset counter for providing a reset pulse to reset the first circuit while the negative voltage is sensed and the transistor is ON, resetting of the first circuit keeping the high-side power switching device turned OFF.

4. The high-side driver of claim 2, wherein the sensor comprise a resistor.

5. The high-side driver of claim 1, wherein the diffusion comprises a ring in said epitaxial region.

6. The high-side driver of claim 1, wherein one of the MOSFETs is an N MOS device and the parasitic transistor comprises a parasitic PNP transistor.

* * * * *